United States Patent
Marsili (10) Patent No.: US 6,947,503 B2
(45) Date of Patent: Sep. 20, 2005

(54) METHOD AND CIRCUIT FOR SYNCHRONIZING A RECEIVER FOR A CONVOLUTIONALLY CODED RECEPTION SIGNAL

(75) Inventor: Stefano Marsili, Fürnitz (AT)

(73) Assignee: Infineon Technologies AG, Munich (DE)

( * ) Notice: Subject to any disclaimer, the term of this patent is extended or adjusted under 35 U.S.C. 154(b) by 759 days.

(21) Appl. No.: 10/007,804

(22) Filed: Nov. 8, 2001

(65) Prior Publication Data

US 2002/0090041 A1 Jul. 11, 2002

(30) Foreign Application Priority Data

Nov. 10, 2000 (DE) .......................... 100 55 658

(51) Int. Cl.$^7$ ............... H03D 1/00; H03L 27/06
(52) U.S. Cl. ............... 375/341; 375/225; 375/226; 375/262; 375/316; 375/324; 455/130; 714/786
(58) Field of Search ............... 375/225, 226, 375/262, 341, 377, 316, 324; 714/786; 455/130

(56) References Cited

U.S. PATENT DOCUMENTS

| | | | |
|---|---|---|---|
| 5,566,206 A | * 10/1996 | Butler et al. | ................ 375/225 |
| 5,581,577 A | * 12/1996 | Abe | ........................... 375/225 |
| 5,694,429 A | * 12/1997 | Sekine et al. | ............... 375/262 |
| 5,757,834 A | * 5/1998 | Fang et al. | ................. 714/789 |
| 5,838,697 A | * 11/1998 | Abe | ........................... 714/796 |
| 5,937,016 A | * 8/1999 | Choi | ......................... 375/341 |
| 6,085,351 A | 7/2000 | Alberty | ...................... 714/798 |
| 6,088,405 A | * 7/2000 | Hladik et al. | ............... 375/341 |
| 6,693,983 B1 | * 2/2004 | Moher et al. | ............... 375/341 |

FOREIGN PATENT DOCUMENTS

| DE | 195 29 982 | 2/1997 | ............ H04L/7/00 |
|---|---|---|---|
| DE | 196 10 163 A | 10/1997 | .......... H03M/13/12 |

OTHER PUBLICATIONS

Kitty K.Y. Wong and Peter J. McLane, SOVA–based Interference Cancellation for Multi–user FEC–coded DS–CDMA for 384kbps transmission in WCDMA, 2001, IEEE.*

* cited by examiner

Primary Examiner—Stephen Chin
Assistant Examiner—Erin M. File
(74) Attorney, Agent, or Firm—Fish & Richardson P.C.

(57) ABSTRACT

A method for synchronizing a receiver for a convolutionally coded reception signal having a sequence of received data symbols includes decoding the convolutionally coded reception signal by means of a Viterbi decoder that calculates a minimum metric signal sequence. The metric signal sequence is then compared with an adjustable threshold value. If metric signal exceeds the threshold value too frequently during a predetermined time period, at least one received data symbol is discarded.

7 Claims, 12 Drawing Sheets

METHOD AND CIRCUIT FOR SYNCHRONIZING A RECEIVER FOR A CONVOLUTIONALLY CODED RECEPTION SIGNAL

FIELD OF INVENTION

The invention relates to a method and a circuit for synchronizing a receiver for a convolutionally coded reception signal, and in particular to a convolutionally coded QAM reception signal.

RELATED APPLICATIONS

This application claims the benefit of the priority date of German application DE 100 55 658.2, file on Nov. 10, 2000, the contents of which are herein incorporated by reference.

BACKGROUND

For convolutional coding, transmitted digital data symbols are provided with redundancy so that error detection and error correction is made possible at the receive end.

Figure 1:
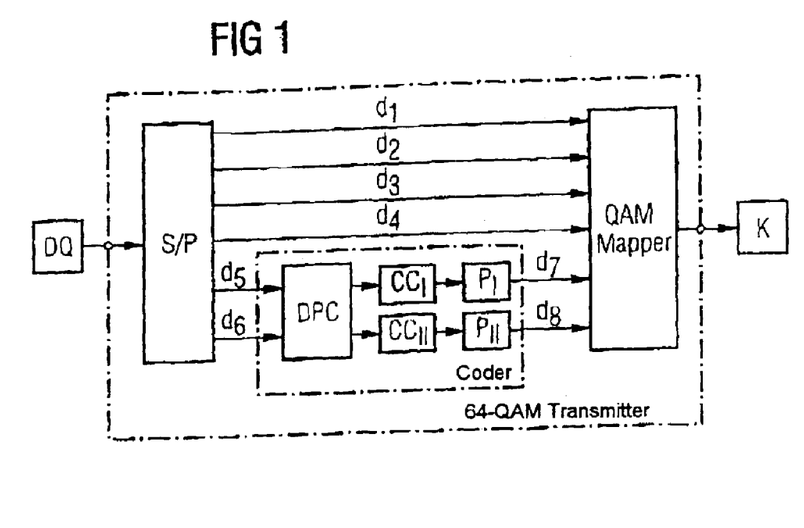
FIG. 1 shows a 64-QAM transmitter according to the prior art.

FIG. 1 shows a 64-QAM transmitter as taught in the prior art. The data originating from a data source DQ are coded in a Reed-Solomon coder and interleaved and transmitted, after scrambling in a scrambler V, to a serial/parallel converter S/P that converts the received scrambled serial data stream into six parallel data streams. In a 64-QAM transmitter, 28 bits of the serial data stream are converted, in accordance with the ITUJ.83 data standard for DOCSIS cable modems, by the serial/parallel converter S/P into four data streams of five bits that are transmitted directly via the data lines d1–d4 in uncoded form, to a downstream QAM mapper. Four bits of the received 28 bits are respectively applied to a coder via data bit lines d5, d6. After coding in a differential precoder (DPC), the four precoded data bits are fed to a binary convolutional coder $CC_I$, $CC_{II}$ (CC=Convolutional Coding).

The convolutional coders $C_I$, $C_I$ each have a puncturing circuit $P_I$, $P_{II}$ connected downstream of them. According to the ITUJ.83 standard, in each case convolutional coders $CC_I$, $CC_{II}$ with a code rate r=½ are used, the applied differentially precoded four data bits in the convolutional coder being recoded into eight data bits, five data bits of which are transmitted to the QAM mapper via the data lines d7, d8 by means of the puncturing circuit P. The QAM mapper performs the quadrature-amplitude-modulated output signal, which can assume 64 statuses, from the six parallel data streams applied, and transmits the output signal to a QAM receiver via a transmission channel K.

Figure 2:
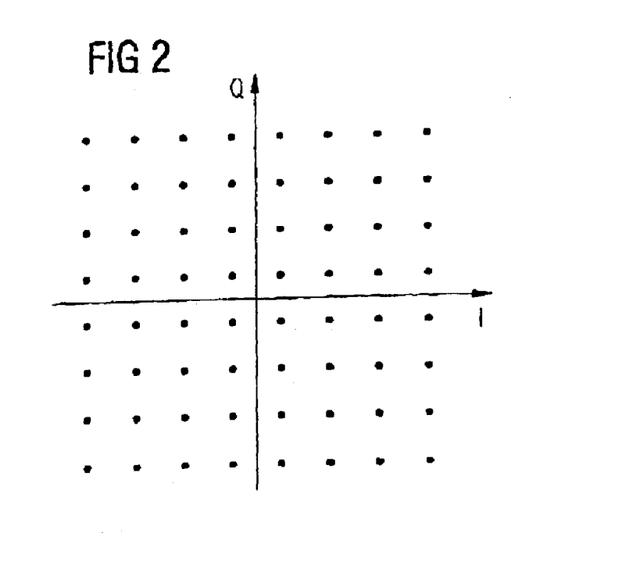
FIG. 2 shows a 64-QAM transmit signal.

FIG. 2 shows a 64-QAM transmit signal with in-phase component I and quadrature component Q.

Figure 3:
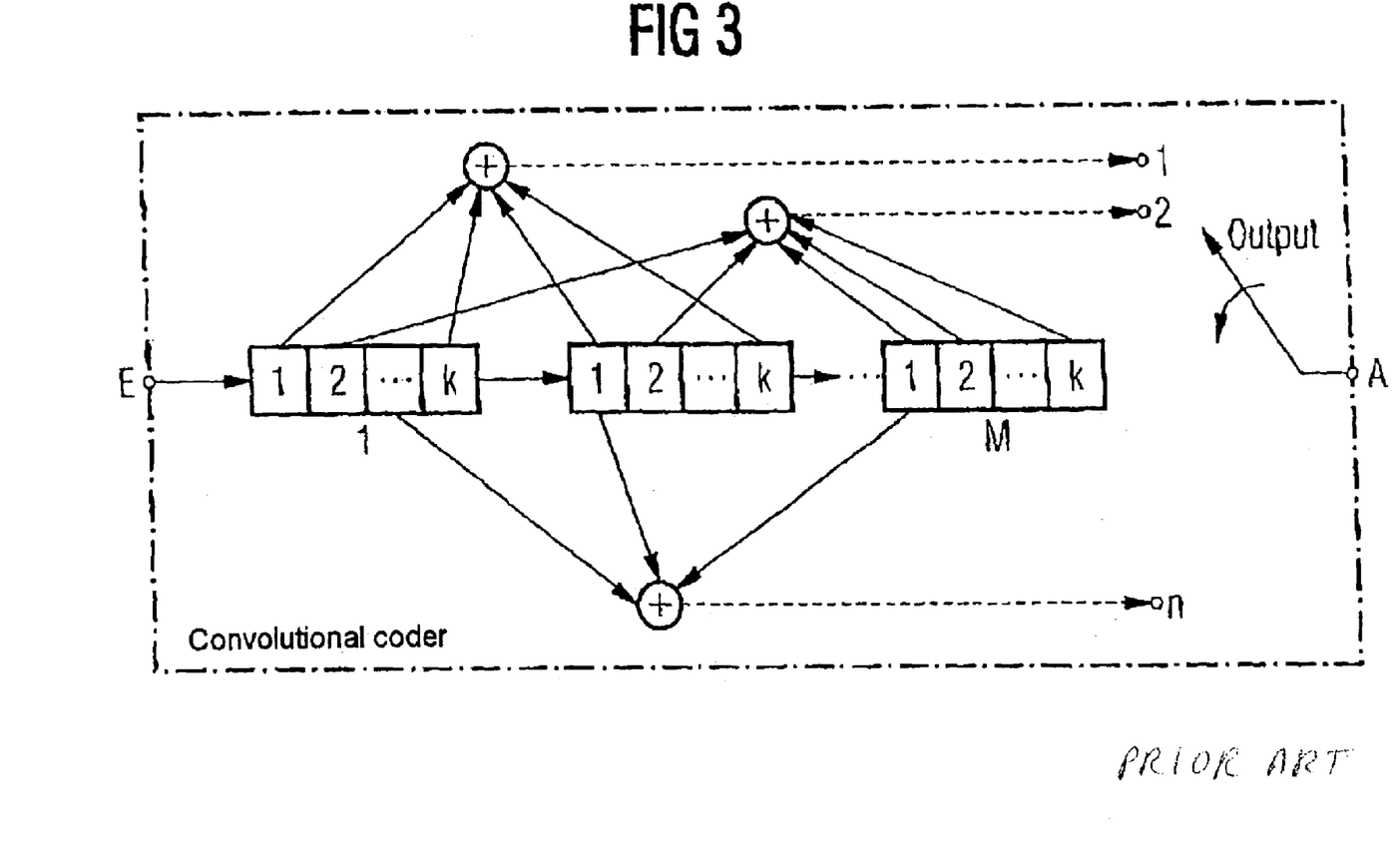
FIG. 3 shows a convolution coder according to the prior art, contained in a transmitter.

FIG. 3 shows the structure of a convolutional coder CC. The convolutional coder CC has an input E and an output A. The serial data stream applied to the input E is written into a k-bit-wide first stage. For each input bit, n output bits are generated. These bits are linear combinations of the data bits contained in the shift register. The convolutional coder CC shown in FIG. 3 has M stages that each contain k data bits. The input bits are composed of a block of k data bits that are written into the first stage 1. The data bits of a stage are shifted to the next stage. The data bits of the last stage are extracted or deleted. The code rate r of the convolutional coder CC is k/n.

As in the case of the block codes, redundancy is additionally added during the convolutional coding in order to be able to detect and correct errors. An essential difference between block codes and convolutional coders is that individual data blocks cannot be successively coded in the latter, but rather continuous coding takes place. The current coding of a transmit data sequence depends on the preceding transmit data sequences.

In each case k new transmit data bits are written into the first stage of the convolutional coder per clock cycle. The number M of stages (constrained length) indicates the number of clock cycles of k new data bits over which a written-in data bit influences the code word. The contents of the individual registers are read out by means of logic-operation circuits and added in v modulus 2 adders and subsequently sampled. The type of logic operations comprises the actual coding rule of the convolutional coder CC.

The method of operation of a convolutional coder CC according to the prior art as represented in FIG. 3 will be explained below by means of an example.

Figure 4:
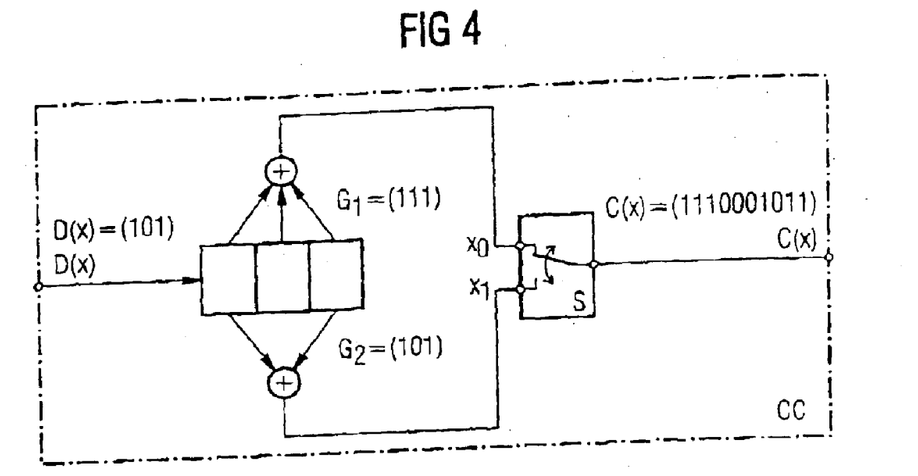
FIG. 4 shows an example of a convolution coder according to the prior art.

The convolutional coder CC illustrated in FIG. 4 has three stages each with a data bit and a coding rate of ½(M=3, k=1, r=½).

The applied transmit data sequence D(x)=(101) is recoded by the convolutional coder CC into the coded output signal sequence C(x)=(1110001011).

In polynomial representation, the convolutional coder illustrated in FIG. 4 can be described as:

$G_1(x)=1+x+x^2$ $G_2(x)=1+x^2$ $C(x)=D(x)G_1(x)$ interleaved with $D(x)G_2(x)$.

Figure 5:
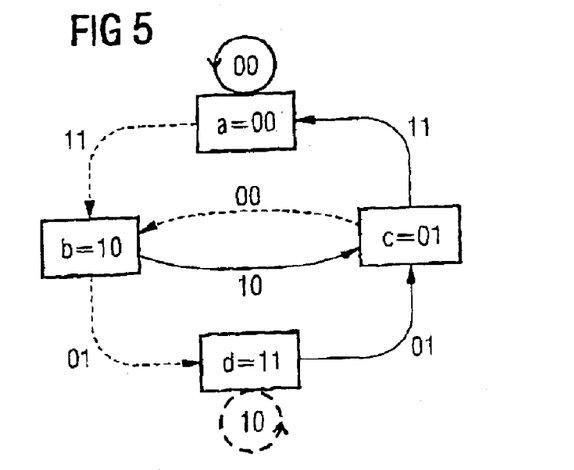
FIG. 5 shows a status diagram of the convolution coder illustrated in FIG. 4.

FIG. 5 shows a status diagram of the convolutional coder illustrated in FIG. 4. The M−1 states of the right-hand part of the shift register composed of three bits are represented in the rectangles. Either the crossovers of the dashed or of the continuous diagram lines are passed through depending on the data bit written in per clock cycle.

If the written-in data bit is a logic zero, the crossovers that are illustrated as a continuous line will take place, whereas when a logic one is written in the crossovers represented by broken lines take place.

Figure 6:
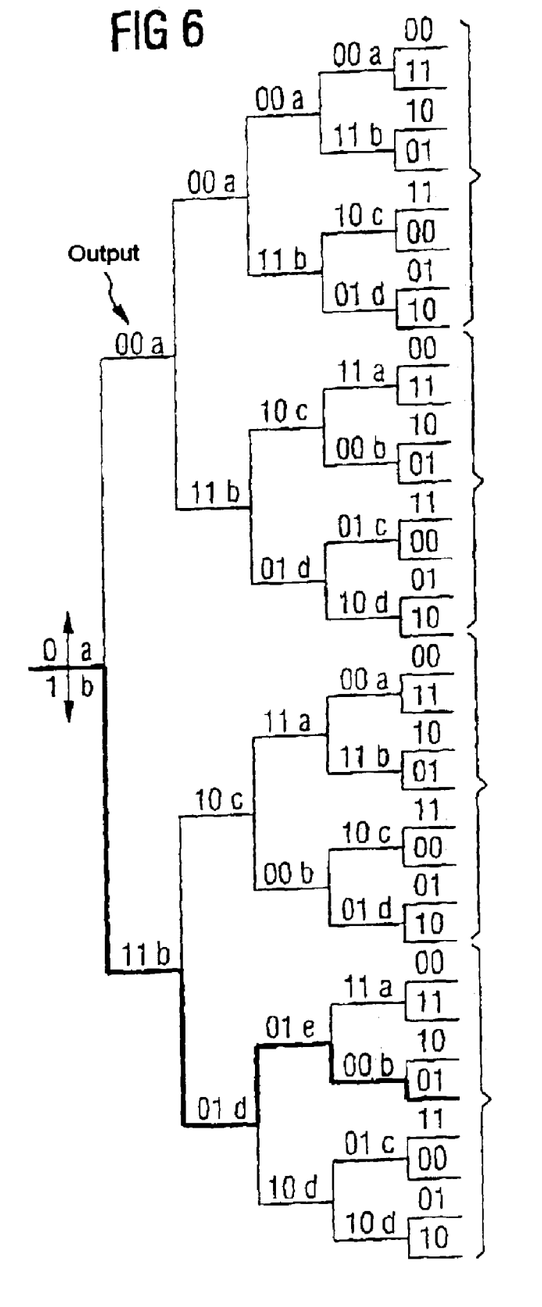
FIG. 6 shows a tree diagram of the convolution coder illustrated in FIG. 4.

FIG. 6 shows the associated tree diagram of the convolutional coder CC represented in FIG. 4. The longer the sequence of data to be transmitted, the more confusing the representation as a tree diagram.

Figure 7:
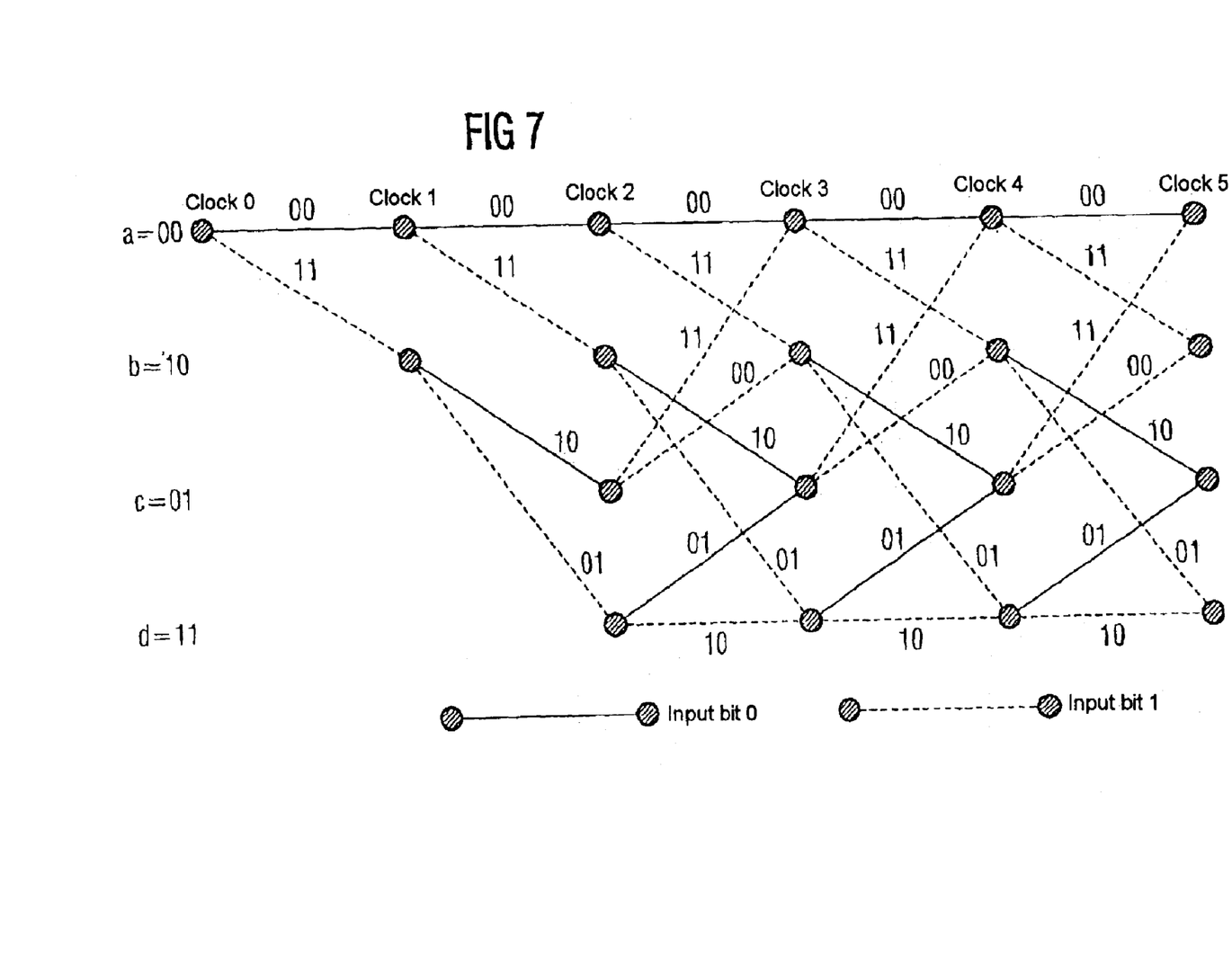
FIG. 7 shows a trellis diagram of the convolution coder illustrated in FIG. 4.
Figure 8:
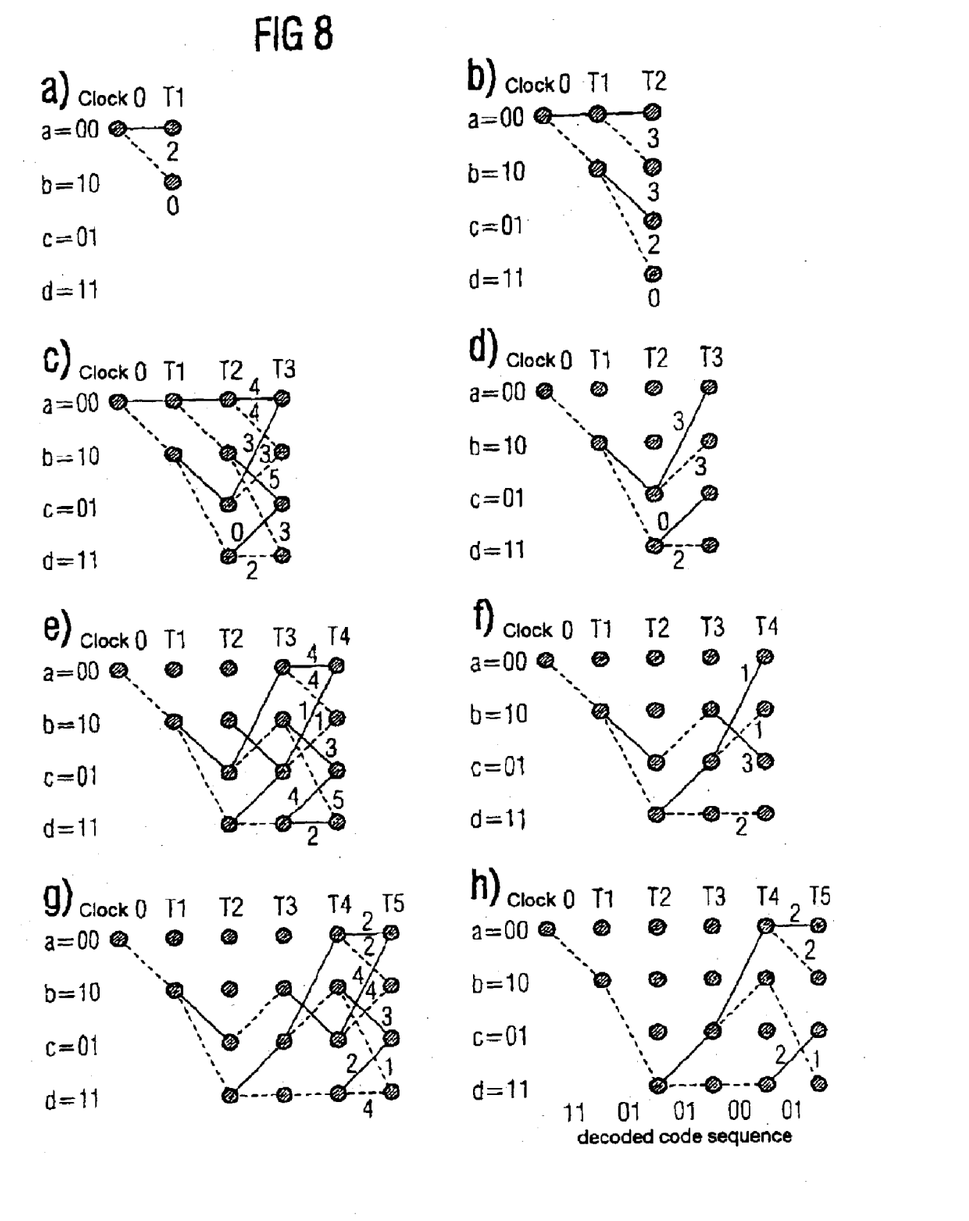
FIGS. 8a–8h show diagrams explaining the method of operation of a conventional Viterbi decoder that is installed in a receiver according to the prior art.

The convolutional rule of a convolutional coder CC is therefore represented in a clearer way than what is referred to as a trellis diagram. FIG. 7 shows the trellis diagram of the convolutional coder CC illustrated in FIG. 4. The four lines correspond to the states of the right-hand part of the register of the convolutional coder. For each clock there are 2 k branching points. As in the status diagram illustrated in FIG. 5, when there is a logic zero as input bit the crossover represented as a continuous line takes place, whereas when a logic one is written in the crossover represented as a broken line takes place. The pairs of numbers associated with the lines each indicate the output values of this status crossover. After M clocks, in each case 2 k different branchings converge again.

FIGS. 8a–8h show by way of example the method of operation of a Viterbi decoder for the coding of a convolutionally coded reception signal as used in receivers according to the prior art. In the example illustrated in FIG. 8a, the Viterbi decoder decodes a convolutionally coded reception signal that has been coded by the convolutional coder CC that is illustrated in FIG. 4 and has the trellis diagram illustrated in FIG. 7. The transmitted code sequence is Cs(x)=(1101010001) in the example illustrated in FIG. 8.

The code sequence received by the receiver (with errors) is: CE(x)=(1101011001).

As in the first step illustrated in FIG. 8a, the first two digits of the received code sequence (11) are compared with the output values of the two trellis branchings. The calculation of the Hamming distance as a metric value yields the value 2 for the upper branching and the value 0 for the lower branching. At the next clock, the Hamming distance between the next digits of the received code sequence (01) and the output values of the now four branchings of the trellis diagram is calculated. FIG. 8b shows the accumulated metric values that are obtained from the sum of the previous metric value of the path and of the metric value calculated for this step.

The calculation of the metric values for the next two digits is carried out in an analogous fashion. FIG. 8c shows the calculated result. As can be seen in FIG. 8c, an end point of in each case two paths now is reached. This is generally the case after M clock pulses. Of these further clock pulses, only that with the lower accumulated metric is used by these two paths for the further calculation. As a result, a significant reduction in the necessary storage requirement in the Viterbi decoder is possible. FIG. 8c shows the result of this selection.

The following two clocks and the respective selection are illustrated in FIGS. 8e–8h. The path printed in bold in FIG. 8h represents, for the overall metric one, the path with the lowest metric.

A comparison of this discovered path with the trellis diagram illustrated in FIG. 7 shows that this signal path corresponds to the code sequence (111010001), i.e. to the code sequence Cs(x) that is actually transmitted. The transmit error was implicitly corrected by means of the Viterbi decoder. This error correction took place in the fourth clock pulse (see FIGS. 8e and 8f) in the example shown. The fact that an error was corrected by the Viterbi decoder is apparent from the fact that the overall metric is no longer equal to zero, as was still the case at the third clock pulse, but rather equal to one. By means of the metric value m, an estimate of the error rate is therefore obtained. By means of the calculated metric value, it is thus possible to estimate the connection quality of the transmission channel. If the case occurs that two different paths of an end point yield the same overall metric, it is possible to detect from this that more errors have occurred than can be corrected. The method of operation of a Viterbi decoder is described in IEEE, Vol. 61, No. 3, March 1973 "The Viterbi Algorithm".

Figure 9:
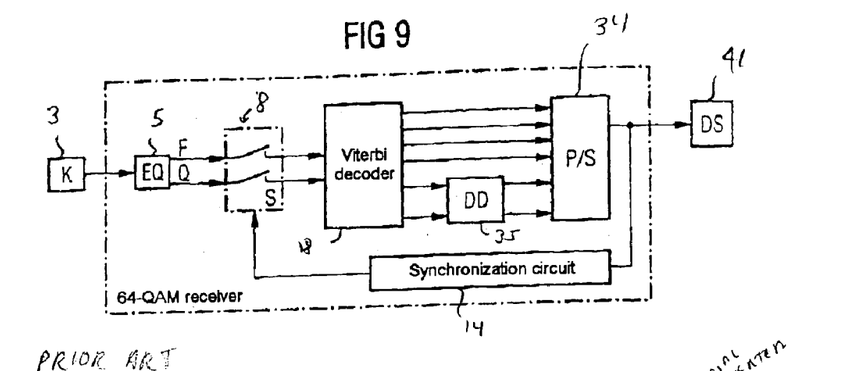
FIG. 9 shows a 64-QAM receiver according to the prior art.

FIG. 9 shows a QAM receiver according to the prior art. The convolutionally coded transmit signal that is output by the 64-QAM transmitter illustrated in FIG. 1 via the transmission channel K is demodulated in an equalizer and the in-phase component I and the quadrature component Q of the QAM transmit signal represented in FIG. 2 are fed to a switching device S. The received data symbols are applied to the input of a Viterbi decoder by the equalizer EQ via the switched data lines. The Viterbi decoder decodes the applied convolutionally coded reception signal and in the process the reception signal sequence is continuously compared with theoretically possible transmit signal sequences, and the degree of correspondence is made the basis of the decision using a static estimation method. The higher value data bits that are output by the Viterbi decoder are fed directly to a parallel/serial converter P/S via four data lines, while the low value data bits are firstly decoded in a differential decoder and then fed to the parallel/serial converter PS. The decoded data is passed on from the output of the parallel/serial converter P/S to any desired data sink DS for further data processing.

In the 64-QAM transmitter illustrated in FIG. 1, the convolutional coders CC each code bit groups composed of four bits that are applied to the data lines d5, d6 in bit groups composed of five bits that are output to the QAM mapper via data lines d7, d8. By puncturing the data bit stream that is output by the convolutional coder CC, three QAM data symbols are generated by the QAM mapper based on the first three data bits, while two further QAM data symbols are generated based on the last of the four input data bits. Puncturing at the puncturing circuit P ensures that a data sequence that follows in accordance with the standard ITUJ.83 is output to the QAM mapper by the coder via the data lines d7, d8:

$$C(x)=x0, x0, x0, x1, x0.$$

The QAM mapper thus generates three QAM transmit data symbols by means of three iterations or shift operations of the two convolutional coders. Two QAM symbols are then generated by means of an iteration or a shift operation of the two convolutional coders.

A synchronization operation must therefore take place in the 64-QAM receiver, as illustrated in FIG. 9, because the three QAM data symbols are to be processed by the Viterbi decoder in a way that differs from that for the next two QAM data symbols.

Therefore, the 64-QAM receiver illustrated in FIG. 9 according to the prior art contains a synchronization circuit. The synchronization circuit is connected to the output of the parallel/serial converter P/S. The data sequence that is output by the parallel/serial converter P/S in the synchronization circuit is compared with a stored known synchronization word data pattern until the synchronization circuit detects correspondence. In the process, a plurality of received data frames are sampled until at least two data frames at the correct data interval contain the known synchronization data word.

However, such a conventional synchronization operation has a number of disadvantages. The synchronization circuit, as illustrated in FIG. 9, requires a comparator memory for the various synchronization data words FSYNC that differ in a 256-QAM receiver and a 64-QAM receiver. In addition, two different search algorithms must be implemented for sensing the different training sequences. A separate counter is provided for sensing the distance between the transmitted data frames. The distance is different in E4-QAM signals and 256-QAM signals. A further counter counts the number of sensed frames. A further counter must be provided for checking for the resetting operation. Because the transmitted synchronization words are approximately 2 milliseconds apart from one another, the time for the synchronization operation in the conventional 64-QAM receiver illustrated in FIG. 9 is long.

SUMMARY

The object of the present invention is therefore to provide a method and a device that permits fast synchronization of a receiver for convolutionally coded reception signals in a way that is simple in terms of circuitry.

The invention provides a method for synchronizing a receiver for a convolutionally coded reception signal that is composed of a sequence of received data symbols, having the following steps:

the convolutionally coded reception signal is decoded by means of a Viterbi decoder that calculates a minimum metric signal sequence of the reception signal;

the signal values of the metric signal sequence calculated by means of the Viterbi decoder are compared with an adjustable threshold value; and at least one received data symbol is discarded if the threshold value is exceeded too frequently by the metric signal sequence within a predetermined time period.

The received data symbols are preferably QAM data symbols.

The received QAM data symbols are preferably 64-QAM or 256-QAM data symbols.

The invention also provides a synchronization circuit for a signal receiver for receiving a convolutionally coded reception signal that is composed of a sequence of data symbols, having:

a switching device for switching through the received convolutionally coded data symbols;

a Viterbi decoder for decoding the switched-through data symbols, the Viterbi decoder calculating a minimum metric signal sequence of the reception signal;

a first comparator circuit for comparing the signal values of the calculated metric signal sequence with an adjustable threshold value;

a counter that counts the number of occasions the threshold value is exceeded in a predetermined time period;

a second comparator circuit for comparing the counter reading of the counter with an adjustable counter threshold value and with the second comparator circuit actuating a switching device in such a manner that a received data symbol is suppressed when the counter threshold value is exceeded.

The convolutionally coded reception signal is preferably a convolutionally coded QAM reception signal.

Preferred embodiments of the synchronization method according to the invention and of the synchronization circuit according to the invention will be described below with reference to the appended drawings in order to explain features that are essential to the invention.

DETAILED DESCRIPTION

Figure 10:
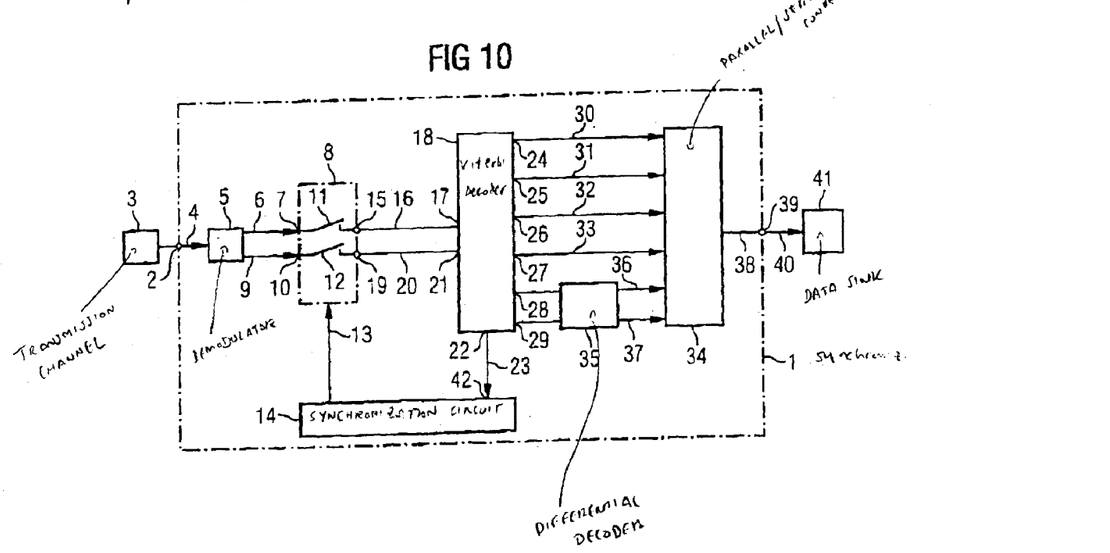
FIG. 10 shows a block diagram of QAM receiver according to the invention.

As is apparent from FIG. 10, the QAM receiver 1 according to the invention contains a signal input 2 for receiving a convolutionally coded reception signal that is transmitted via a transmission channel 3 and is composed of a sequence of data symbols, for example QAM data symbols. The QAM receiver 1 is preferably a 64-QAM receiver or a 256-QAM receiver. The received 64-QAM data symbols are composed of six bits, two bits of which are convolutionally coded. The data symbols are fed via data lines 4 to an equalizer or a demodulator circuit 5 that feeds the in-phase signal component I via a data line 6 to an input 7 of a switching device 8. The demodulator 5 outputs the quadrature component Q of the QAM-modulated reception signal to a second input 10 of the switching device 8 via a further data line 9. The switching device 8 contains two controllable switches 11, 12 that are actuated by a synchronization circuit 14 via control lines 13. The switching device 8 has a first signal input 15 that is connected via a signal line 16 to a first input 17 of a Viterbi decoder 18. The Viterbi decoder 18 receives via the signal input 17 the switched-through in-phase component I of the received quadrature-amplitude-modulated reception signal.

The switching device 8 has a signal output 19 that is connected via a line 20 to a second input 21 Of the Viterbi decoder 18 The Viterbi decoder 18 receives the quadrature component Q of the reception signal via the signal input 21. The Viterbi decoder 18 carries out decoding of the QAM data symbols switched through by the switching device 8, the Viterbi decoder 18 calculating, during the decoding operation, a signal sequence of minimum metric values for detecting the optimum path within the trellis diagram. The Viterbi decoder 18 outputs the calculated signal sequence of minimum metric values of the QAM reception signal via an output 22, and to the synchronization circuit 14 via a line 23. The synchronization circuit 14 evaluates the received metric signal and actuates the switching device 8 via the control line 13 as a function of the received metric signal.

The Viterbi decoder 18 of the 64-QAM receiver according to the invention that is illustrated in FIG. 10 has six signal outputs 24–29, the four signal outputs 24–27 for the non-precoded data bits being transmitted directly via associated data lines 30–33 to a parallel/serial converter 34. The precoded data bits are firstly decoded by a differential decoder 35 and then also transmitted to the parallel/serial converter 34 via lines 36, 37. The parallel/serial converter 34 converts the parallel data streams present at the six inputs into a serial data stream and outputs it via a line 38 to a serial data output 39 of the QAM receiver 1. The serial data output 39 of the QAM receiver 1 is connected via a data line 40, a deinterleaver, a descrambler and a Reed-Solomon decoder to any desired data sink 41 for further data processing of the decoded data.

Figure 11:
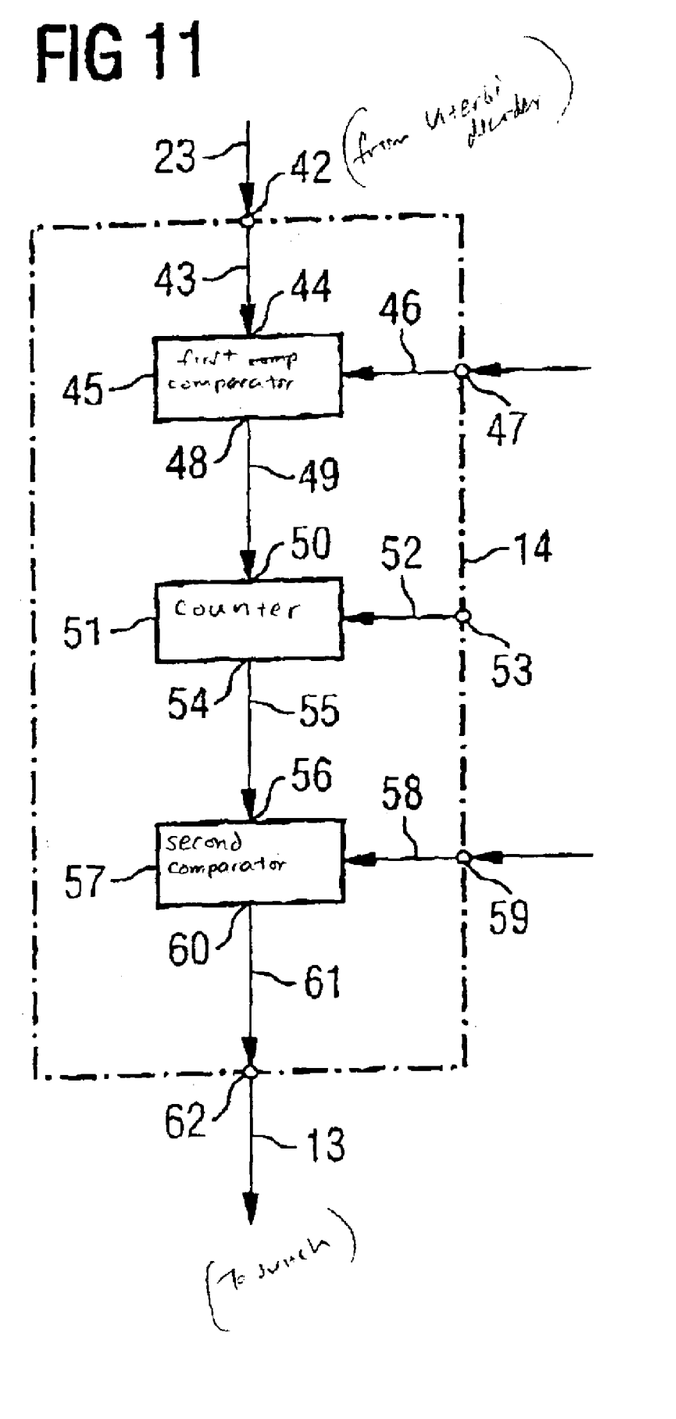
FIG. 11 shows the circuit design of a synchronization circuit according to the invention.

FIG. 11 shows the circuit design of the synchronization circuit 14 illustrated in FIG. 10. The synchronization circuit 14 has a control input 42 for receiving the metric signal that is output by the Viterbi decoder 18. The input 42 of the synchronization circuit 40 is connected via a signal line 43 to the input 44 of a first comparator circuit 45. The first comparator circuit 45 compares the applied signal values of the calculated metric signal sequence with an adjustable threshold value that can be adjusted by means of an adjustment line 46 and an adjustment terminal 47 of the synchronization circuit 14. The first comparator circuit 45 has a control output 48 that is connected via a control line 49 to an input 50 of a counter 51. The counter counts the number of occasions when the threshold value is exceeded within a predetermined time period. The counter 51 can be reset by means of a resetting line 52 and a resetting terminal 53. The counter 51 is connected at the output end to an input 56 of a second comparator circuit 57 via a counter output 54 and a line 55, the comparator circuit 57 comparing the counter reading at the output of the counter 51 with an adjustable counter place value. The counter place value can be adjusted by means of an adjustment line 58 and an adjustment terminal 59 of the synchronization circuit 14. The second comparator circuit 57 has a control output 60 that is connected via a line 61 to a control output 62 of the synchronization circuit 14 The control output 62 Of the synchronization circuit 14 controls the switching device 8 illustrated in FIG. 10 via the control line 13.

Figure 12:
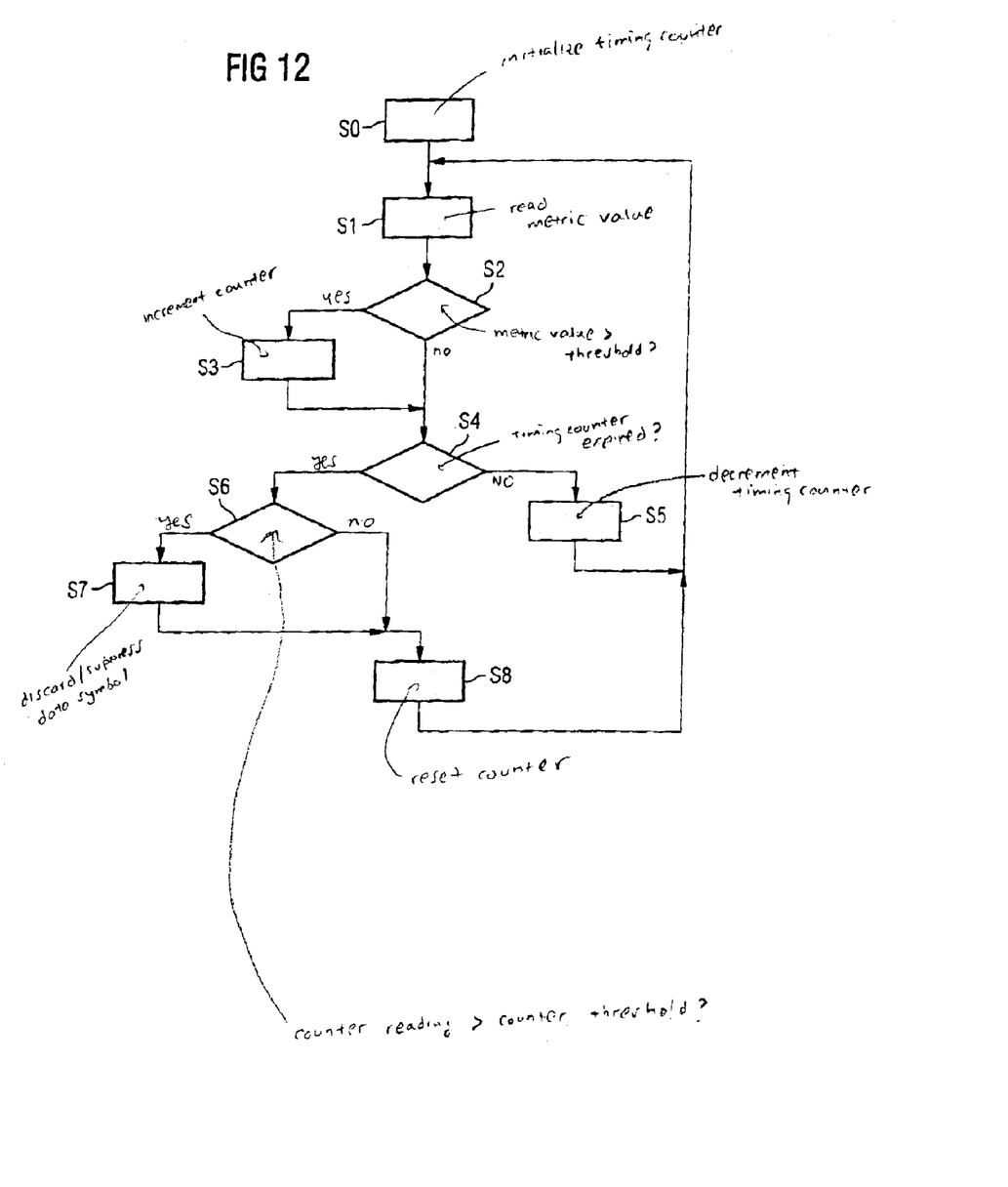
FIG. 12 shows a flowchart of a preferred embodiment of the synchronization method according to the invention.

FIG. 12 shows a flowchart of the preferred embodiment of the synchronization method according to the invention.

In a step S0, a timing counter is initialized. For example, 2048 QAM data symbols are to be checked at the signal output 24–29 of the Viterbi decoder 18, this corresponding to 2560 received QAM data symbols. The time period required for this is approximately 0.5 milliseconds.

In a step S1, the metric value applied to the signal input 42 of the synchronization circuit 14 is read in and in a step S2 it is checked whether the calculated metric value exceeds a specific adjustable threshold value. The threshold value is, for example, eight so that the first comparator circuit 45 only has to check the three highest order bits MSB of the applied metric signal.

If the threshold value is exceeded, in a step S3 the counter 51 within the synchronization circuit 14 is incremented and this system moves on to step S4. If the threshold value is not exceeded by the applied metric value, the system moves from step S2 directly to step S4.

In step S4 it is checked whether or not the timing counter initialized in step S0 has expired. If the timing counter, which is preferably implemented as a decrementing counter, has not yet expired, it is decremented in step S5.

If the time period that is to be monitored has expired and the timing counter has reached the value 0, in step S6, the counter reading of the counter 51 is read out and compared with a counter threshold value that can be counted in. If the counter has reached the maximum counter threshold value (and has then overflowed), the synchronization circuit 14 detects that synchronization has not yet been achieved, and in a step S7 the comparator circuit 57 actuates the switching device 8 in such a way that an applied QAM data symbol is discarded or suppressed.

If the maximum permitted counter reading has not yet been reached, in step S6 it is decided that synchronization has already taken place and the sequence goes directly on to step S8

In step S8, the counter 51 within the synchronization circuit 14 is reset to zero, and the timing counter is set to the maximum time. The sequence then returns to step S1.

Figure 13:
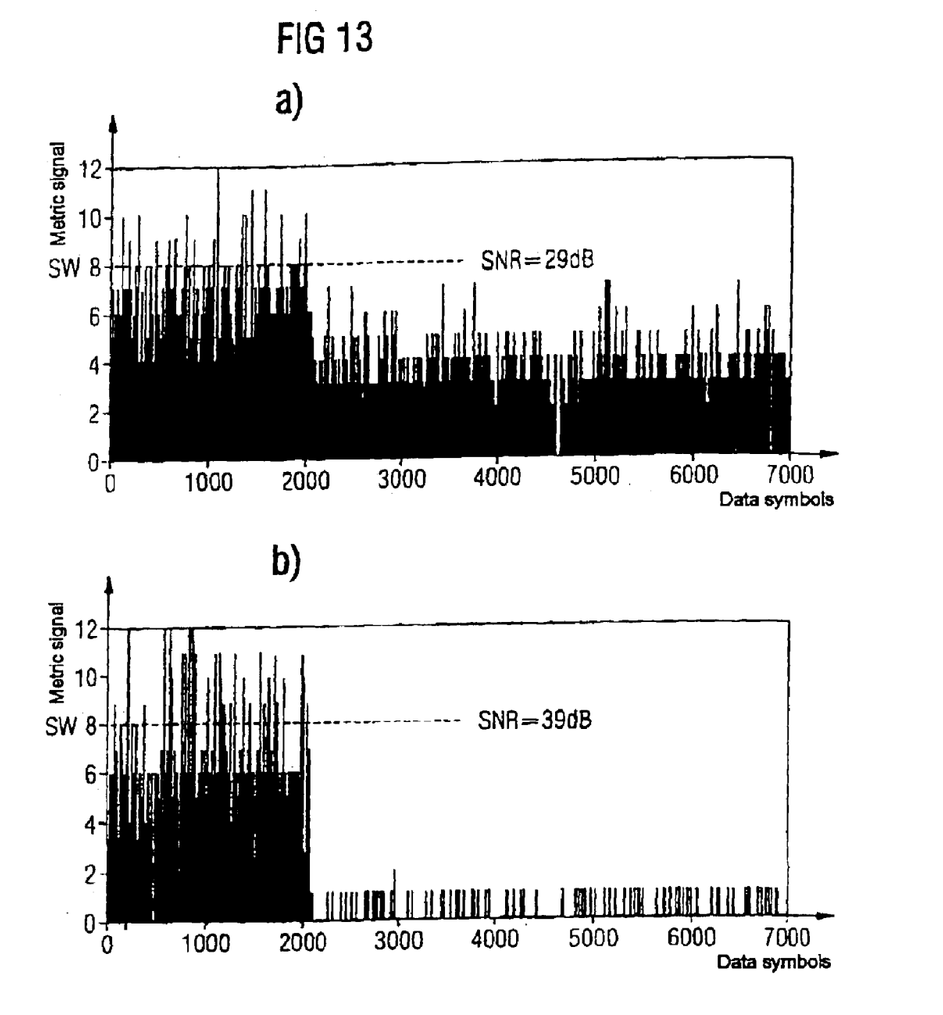
FIGS. 13a, 13b show signal flowcharts of the low signal sequence that is output by the Viterbi decoder within the receiver according to the invention.

FIGS. 13a, 13b show the metric signals that are output by the Viterbi decoder 18, for different signal-to-noise ratios SNR on the transmission channel 3. In the examples shown in FIGS. 13a, 13b, there is no synchronization for the first 2000 received data symbols synchronization has taken place for the following 5000 data symbols. The examples shown in the two FIGS. 13a, 13b relate to a 256-QAM receiver with a poor signal-to-noise ratio of 29 dB and a good signal-to-noise ratio of 39 dB. As is apparent from the two FIGS. 13a, 13b, the mean value of the metric signal with a large degree of noise on the transmission channel is greater than with a small degree of noise. The data symbols with the highest metric values are the consequence of incorrect synchronization, and the influence of the noise on these data symbols is weak.

Figure 14:
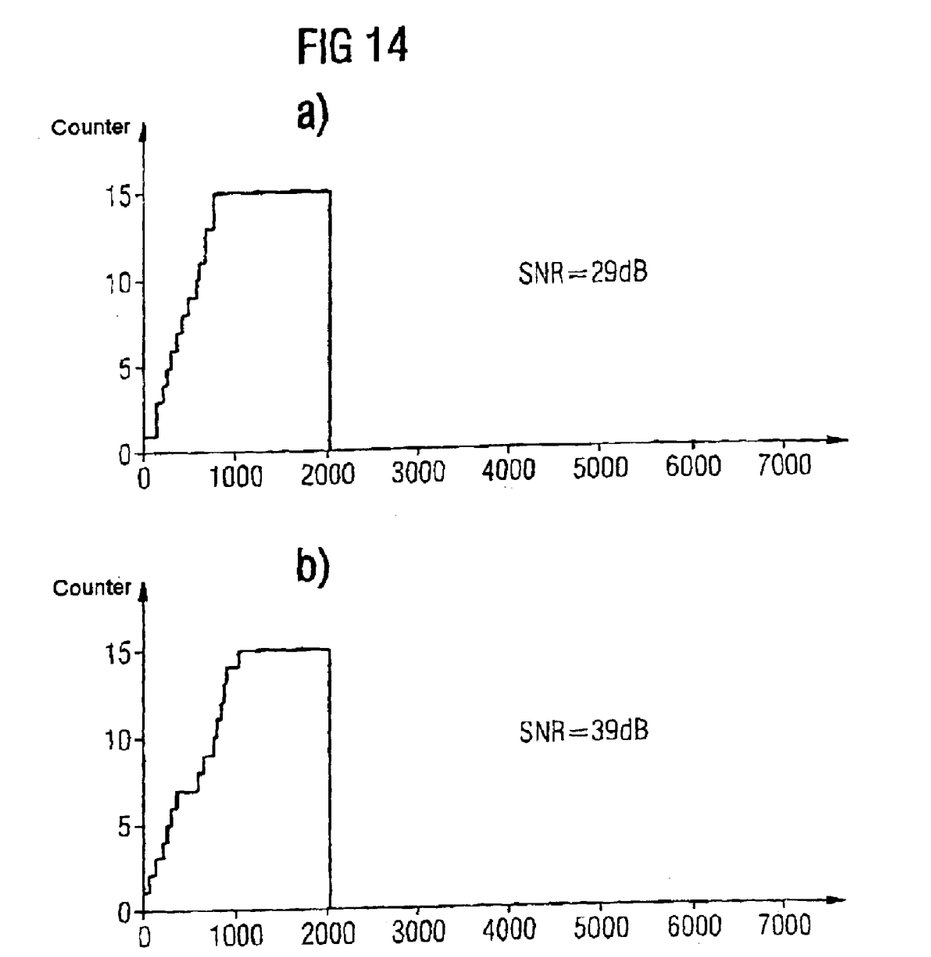
FIGS. 14a, 14b show the counter value with different signal-to-noise ratios of a preferred embodiment of the synchronization method according to the invention.

FIG. 14 shows the value profile of the counter 51 within the synchronization circuit 14 for the cases shown in FIGS. 13a, 13b. As is apparent from comparison of the two counter profiles, the different between the counter values with a good signal-to-noise ratio SNR of the transmission channel 3 and with a poor signal-to-noise ratio SNR of the transmission channel 3 is almost identical. The counter 51 exceeds the error threshold value 15 if no synchronization or alignment is achieved and assumes very low values if the QAM receiver is synchronized to the reception signal.

Figure 15:
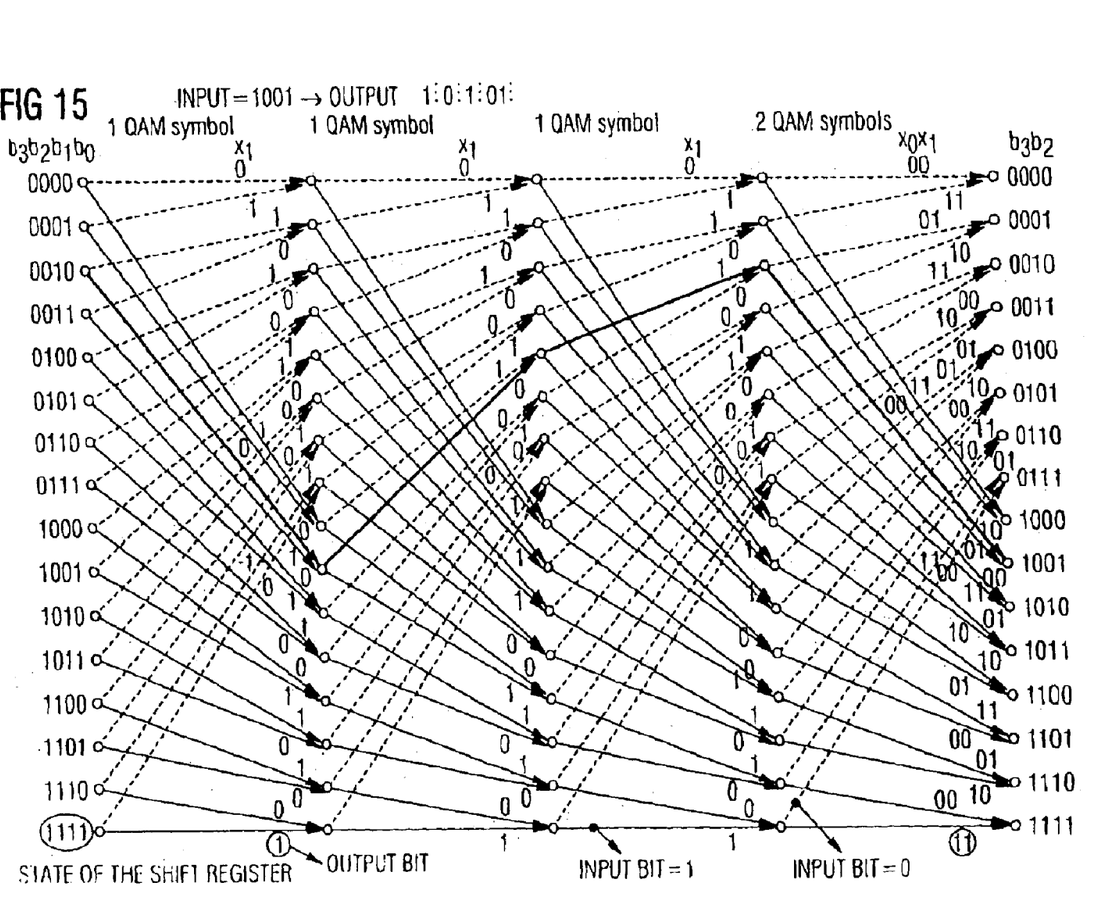
FIG. 15 shows a trellis diagram of the convolution coding and decoding such as is used in a preferred embodiment of the method according to the invention.

FIG. 15 shows an example of a trellis diagram such as is used by the Viterbi decoder 18, illustrated in FIG. 10, for transmitting the metric signal.

What is claimed is:

1. A method for synchronizing a receiver for a convolutionally coded reception signal having a sequence of received data symbols, said method comprising:
    decoding the convolutionally coded reception signal by means of a Viterbi decoder that calculates a minimum metric signal sequence;
    comparing the signal values of the metric signal sequence with an adjustable threshold value; and
    discarding at least one received data symbol if the threshold value is exceeded too frequently by the metric signal sequence during a predetermined time period.

2. The method as claimed in claim 1, further comprising selecting the received data symbols to be quadrature amplitude modulation data symbols.

3. The method as claimed in claim 1, further comprising selecting the received data symbols from the group consisting of 64-quadrature amplitude modulation data symbols and 256-quadrature amplitude modulation data symbols.

4. A synchronization circuit for a signal receiver for receiving a convolutionally coded reception signal which is composed of a sequence of data symbols, having:
    a switching device for switching the received convolutionally coded data symbols;
    a Viterbi decoder for decoding the switched-through data symbols, the Viterbi decoder calculating a minimum metric signal sequence of the reception signal;
    a first comparator circuit for comparing the signal values of the calculated metric signal sequence with an adjustable threshold value;
    a counter which counts the number of occasions the threshold value is exceeded;
    a second comparator circuit for comparing the counter reading of the counter with an adjustable counter threshold value, the second comparator circuit actuating the switching device to suppress a received data symbol when the counter threshold value is exceeded.

5. The synchronization circuit as claimed in claim 4, wherein the reception signal is a quadrature amplitude modulation reception signal.

6. A synchronization circuit for a signal receiver configured to receive a convolutionally coded reception signal having of a sequence of data symbols, said circuit comprising:
- a switching device for providing switched-through data symbols by switching the sequence of data symbols;
- a Viterbi decoder configured to receive the switched-through data symbols from the switching device and to decode the switched-through data symbols, the Viterbi decoder providing a minimum metric signal sequence of the reception signal;
- a first comparator circuit for comparing the signal values of the calculated metric signal sequence with an adjustable threshold value;
- a counter that maintains a counter reading indicative of the number of times the adjustable threshold value is exceeded; and
- a second comparator circuit for comparing the counter reading with an adjustable counter threshold value; and
- a second comparator circuit for comparing the counter reading with an adjustable counter threshold value, the second comparator circuit being configured to cause the switching device to suppress a received data symbol when the counter threshold value is exceeded.

7. The synchronization circuit as claimed in claim 6, wherein the signal receiver is configured to receive, as the reception signal, a quadrature amplitude modulation reception signal.

* * * * *